US012787271B2

(12) United States Patent
Choi

(10) Patent No.: US 12,787,271 B2
(45) Date of Patent: Nov. 3, 2026

(54) SEMICONDUCTOR DEVICE AND METHOD OF MANUFACTURING THE SEMICONDUCTOR DEVICE

(71) Applicant: SK hynix Inc., Icheon-si (KR)

(72) Inventor: Mi Ra Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 780 days.

(21) Appl. No.: 17/873,797

(22) Filed: Jul. 26, 2022

(65) Prior Publication Data

US 2023/0292500 A1 Sep. 14, 2023

(30) Foreign Application Priority Data

Mar. 10, 2022 (KR) ........................ 10-2022-0030215

(51) Int. Cl.

*H10B 20/00* (2023.01)
*H10W 20/00* (2026.01)
*H10W 20/42* (2026.01)

(52) U.S. Cl.

CPC .......... *H10B 20/60* (2023.02); *H10W 20/056* (2026.01); *H10W 20/42* (2026.01)

(58) Field of Classification Search

CPC ........ H10B 20/60; H10B 41/30; H10B 41/40; H10B 41/27; H10B 43/30; H01L 21/76877; H01L 23/5226

See application file for complete search history.

(56) References Cited

U.S. PATENT DOCUMENTS 9,985,048 B2 * 5/2018 Lee ........................ H10B 43/27
2013/0099306 A1 * 4/2013 Choi ...................... H10B 43/27 257/329
2016/0307632 A1 * 10/2016 Lee ........................ G11C 16/14
2017/0338241 A1 11/2017 Lee
2019/0081052 A1 * 3/2019 Lee ........................ H10B 41/41
2020/0105783 A1 * 4/2020 Baek ...................... H10B 43/10
2020/0243555 A1 7/2020 Hu et al.
2020/0312861 A1 10/2020 Kim

FOREIGN PATENT DOCUMENTS

CN 110767657 A 2/2020
CN 113206102 A 8/2021
CN 113594170 A 11/2021

(Continued)

*Primary Examiner* — Khaja Ahmad

(74) *Attorney, Agent, or Firm* — WILLIAM PARK AND ASSOCIATES LTD.

(57) ABSTRACT

Provided herein may be a semiconductor device and a method of manufacturing the semiconductor device. The semiconductor device includes a peripheral circuit structure formed on a substrate including a cell region and a contact region, a cell stacked body formed over the peripheral circuit structure to overlap the cell region, a dummy stacked body formed over the peripheral circuit structure to overlap the contact region, a pillar structure configured to penetrate the cell stacked body, an etch stop layer located over the peripheral circuit structure and overlapping with a bottom surface of the pillar structure, a cutting structure penetrating the pillar structure in a vertical direction and contacting the etch stop layer, and a contact plug penetrating the dummy stacked body and extending to the peripheral circuit structure.

18 Claims, 14 Drawing Sheets

(56) References Cited

FOREIGN PATENT DOCUMENTS

| | | | |
|---|---|---|---|
| KR | 1020170026102 | A | 3/2017 |
| KR | 1020170048393 | A | 5/2017 |
| KR | 1020170131945 | A | 12/2017 |
| KR | 1020210010210 | A | 1/2021 |
| KR | 1020210032592 | A | 3/2021 |
| KR | 1020210090577 | A | 7/2021 |

* cited by examiner

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2022-0030215, filed on Mar. 10, 2022, in the Korean Intellectual Property Office, the entire disclosure of which is incorporated herein by reference.

BACKGROUND

1. Technical Field

Various embodiments of the present disclosure generally relate to an electronic device, and more particularly to a semiconductor device and a method of manufacturing the semiconductor device.

2. Related Art

A nonvolatile memory device is a memory device which retains stored data even when the supply of power is interrupted. Recently, as a two-dimensional (2D) nonvolatile memory device in which memory cells are formed on a substrate in a single layer is reaching its physical scaling limit, three-dimensional (3D) nonvolatile memory devices including memory cells vertically stacked on a substrate have been proposed.

Such a 3D nonvolatile memory device may include interlayer insulating layers and gate electrodes that are alternately stacked on each other, and channel layers penetrating through the interlayer insulating layers and the gate electrodes, with memory cells stacked along the channel layers. To improve the operational reliability of such a nonvolatile memory device having a 3D structure, various structures and manufacturing methods have been developed.

SUMMARY

An embodiment of the present disclosure may provide for a semiconductor device. The semiconductor device may include a peripheral circuit structure formed on a substrate including a cell region and a contact region, a cell stacked body formed over the peripheral circuit structure to overlap the cell region, a dummy stacked body formed over the peripheral circuit structure to overlap the contact region, a pillar structure penetrating the cell stacked body, an etch stop layer located over the peripheral circuit structure and overlapping with a bottom surface of the pillar structure, a cutting structure penetrating the pillar structure in a vertical direction and contacting the etch stop layer, and a contact plug penetrating the dummy stacked body and extending to the peripheral circuit structure.

An embodiment of the present disclosure may provide for a method of manufacturing a semiconductor device. The method may include forming a peripheral circuit structure on a substrate including a cell region and a contact region, forming an interlayer insulating layer over the peripheral circuit structure, and forming an etch stop layer in the interlayer insulating layer, forming an upper stacked body over the interlayer insulating layer, forming a pillar structure penetrating the upper stacked body in the cell region, and simultaneously forming a trench and a hole, the trench separating the pillar structure into a first pillar structure and a second pillar structure and the hole passing through the upper stacked body in the contact region.

An embodiment of the present disclosure may provide for a method of manufacturing a semiconductor device. The method may include forming a peripheral circuit structure on a substrate including a cell region and a contact region, forming an interlayer insulating layer over the peripheral circuit structure, and forming an etch stop layer in the interlayer insulating layer, forming a lower stacked body on the interlayer insulating layer in the cell region, and forming a buffer layer on the interlayer insulating layer in the contact region, forming an upper stacked body on the lower stacked body and the buffer layer, forming a pillar structure penetrating the upper stacked body in the cell region, and simultaneously forming a trench and a hole, the trench separating the pillar structure into a first pillar structure and a second pillar structure and the hole passing through the upper stacked body in the contact region.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings.

Various embodiments of the present disclosure are directed to a semiconductor device including a multi-cell plug and a method of manufacturing the semiconductor device.

Figure 1A:
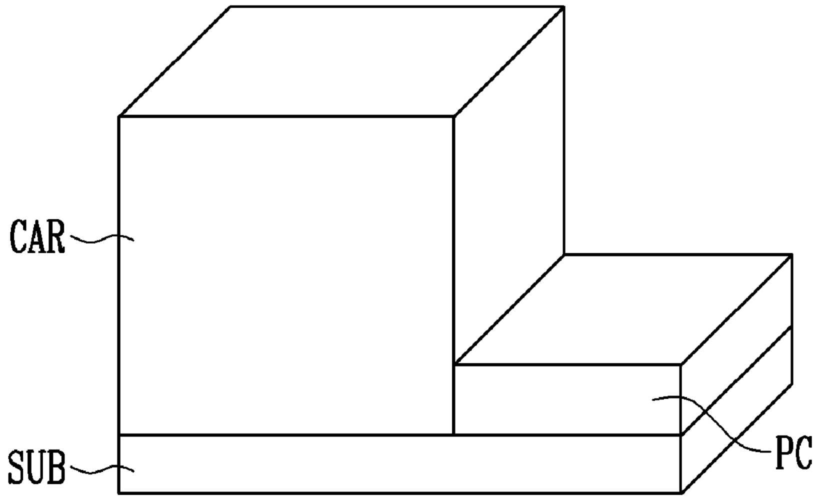
FIGS. 1A and 1B are perspective views schematically illustrating semiconductor devices according to embodiments of the present disclosure.
Figure 1B:
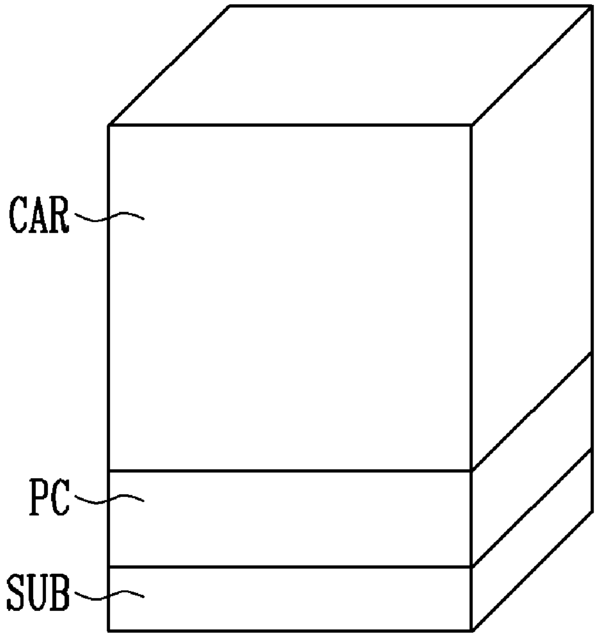

FIGS. 1A and 1B are perspective views schematically illustrating semiconductor devices according to embodiments of the present disclosure.

Referring to FIGS. 1A and 1B, each of the semiconductor devices according to embodiments of the present disclosure may include a peripheral circuit structure PC and a cell array CAR that are arranged on a substrate SUB.

The substrate SUB may be a single-crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film substrate formed using a selective epitaxial growth method.

The cell array CAR may include a plurality of memory blocks. Each of the memory blocks may include a plurality of cell strings. Each of the cell strings is electrically connected to a bit line, a source line, word lines, and select lines. Each of the cell strings may include memory cells and select transistors which are connected in series to each other. Each of the select lines may be used as a gate electrode of a select transistor corresponding thereto, and each of the word lines may be used as a gate electrode of a memory cell corresponding thereto.

The peripheral circuit structure PC may include NMOS transistors, PMOS transistors, a resistor, and a capacitor which are electrically connected to the cell array CAR. The NMOS and PMOS transistors, the resistor, and the capacitor may be used as elements constituting a row decoder, a column decoder, a page buffer, and a control circuit.

As illustrated in FIG. 1A, the peripheral circuit structure PC may be disposed in a partial region of the substrate SUB that does not overlap the cell array CAR.

Alternatively, as illustrated in FIG. 1B, the peripheral circuit structure PC may be disposed between the cell array CAR and the substrate SUB. In this case, in an embodiment, since the peripheral circuit structure PC overlaps the cell array CAR, the area of the substrate SUB occupied by the cell array CAR and the peripheral circuit structure PC can be reduced.

Figure 2:
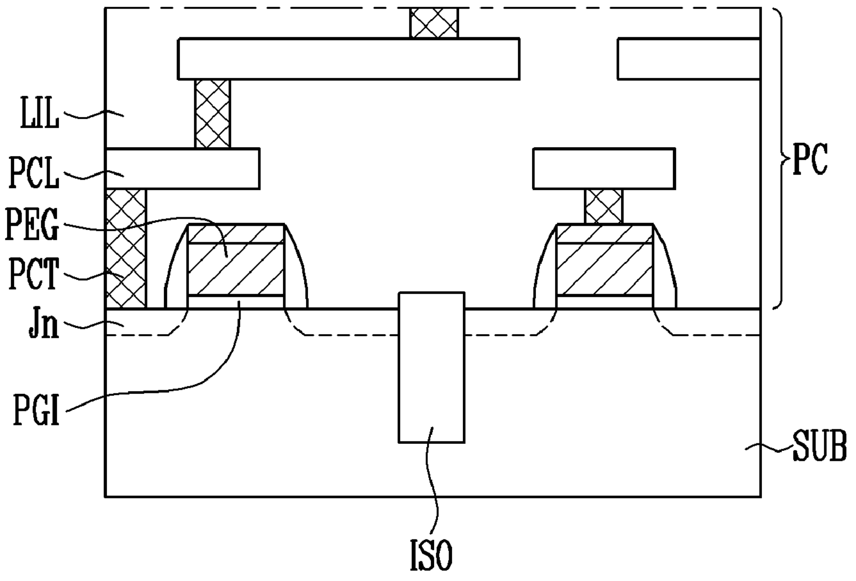
FIG. 2 is a sectional view schematically illustrating a peripheral circuit structure.

FIG. 2 is a sectional view schematically illustrating a peripheral circuit structure.

The peripheral circuit structure PC illustrated in FIG. 2 may be included in the peripheral circuit structure illustrated in FIG. 1A, or may be included in the peripheral circuit structure illustrated in FIG. 1B.

Referring to FIG. 2, the peripheral circuit structure PC may include peripheral gate electrodes PEG, peripheral gate insulating layers PGI, junctions in, peripheral circuit lines PCL, and peripheral contact plugs PCT. The peripheral circuit structure PC may be covered with a peripheral circuit structure insulating layer LIL formed on the substrate SUB.

The peripheral gate electrodes PEG may be used as gate electrodes of NMOS transistors and PMOS transistors of the peripheral circuit structure PC. The peripheral gate insulating layers PGI may be disposed between the respective peripheral gate electrodes PEG and the substrate SUB.

The junctions Jn, which are regions defined by injecting n-type or p-type impurities into the active region of the substrate SUB, may be disposed on both sides of each of the peripheral gate electrodes PEG, and may be used as source junctions or drain junctions. The active region of the substrate SUB may be separated by an isolation layer ISO formed in the substrate SUB. The isolation layer ISO is made of an insulating material.

The peripheral circuit lines PCL may be electrically connected to transistors, a resistor, and a capacitor, which constitute the circuit of the peripheral circuit structure PC, through the peripheral contact plugs PCT.

The peripheral circuit structure insulating layer LIL may include insulating layers stacked in a multi-layer structure.

Figure 3A:
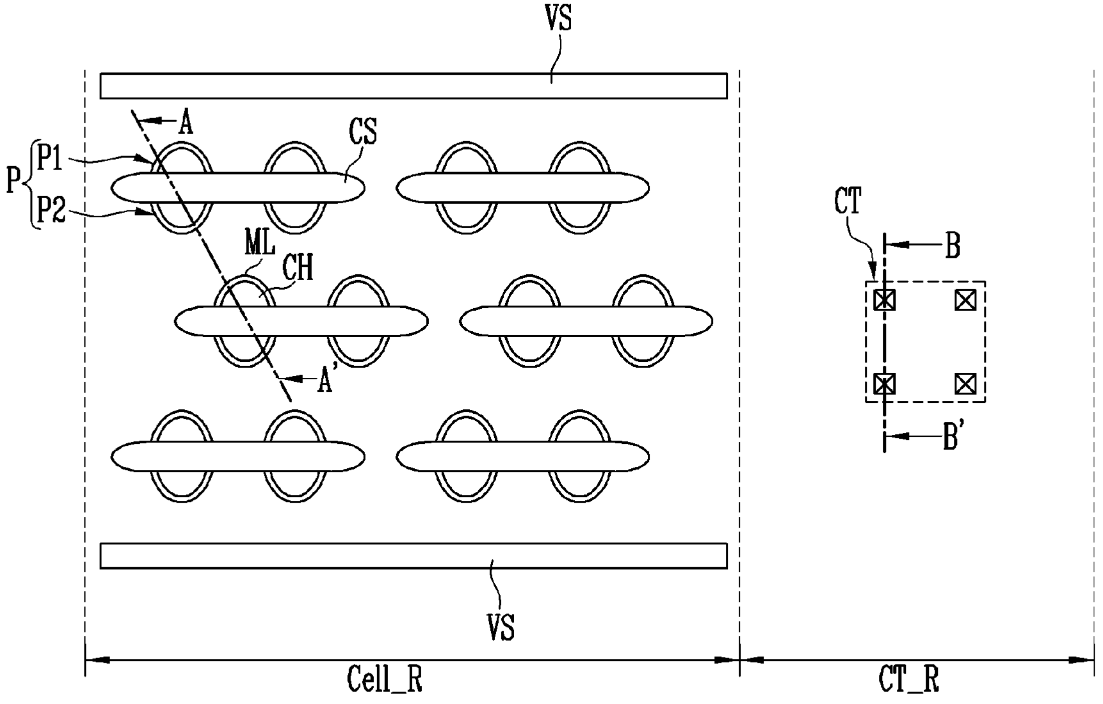
FIGS. 3A and 3B are a plan view and a sectional view, respectively, illustrating a semiconductor device according to an embodiment of the present disclosure.
Figure 3B:
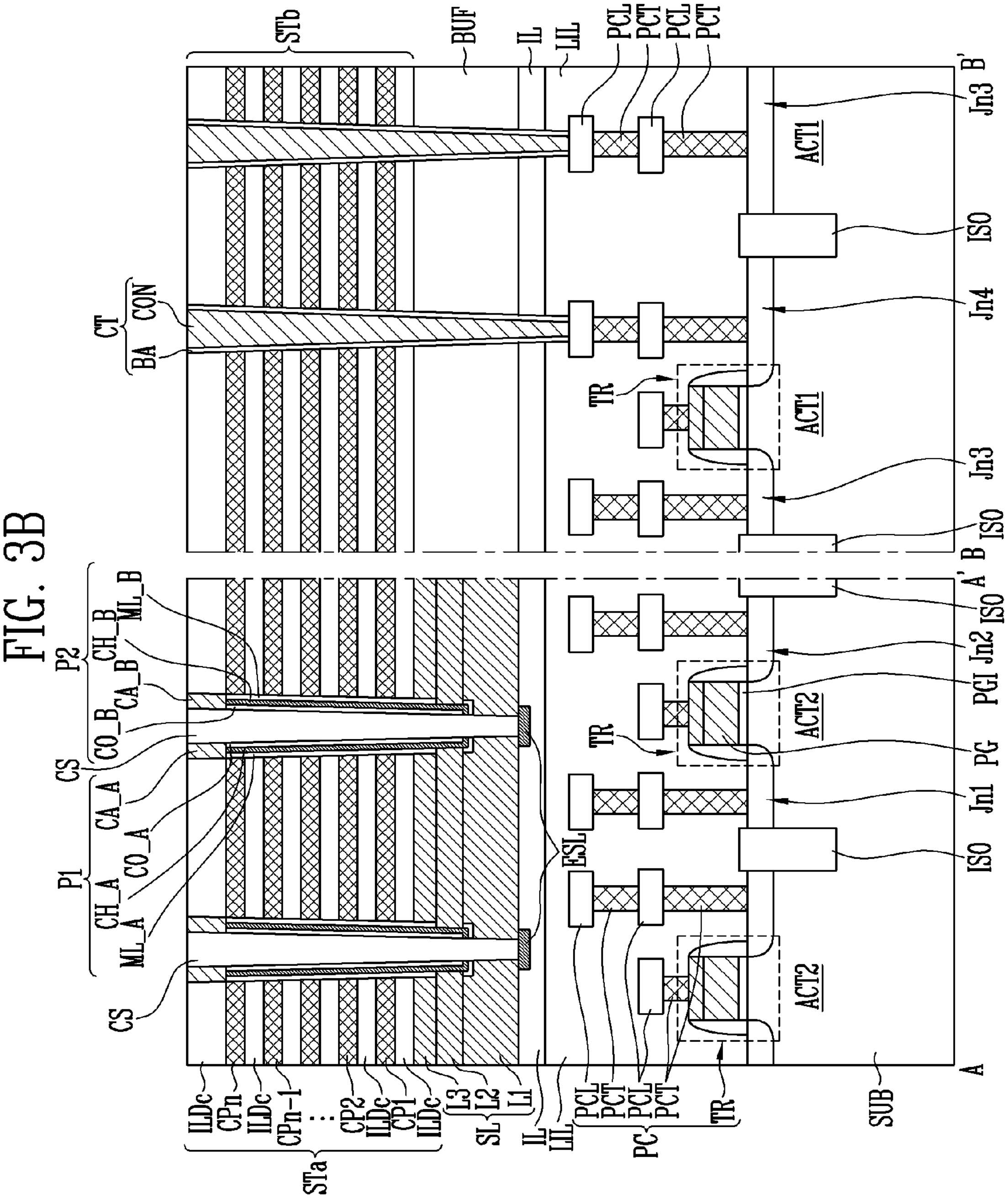

FIGS. 3A and 3B are a plan view and a sectional view, respectively, illustrating a semiconductor device according to an embodiment of the present disclosure.

Referring to FIGS. 3A and 3B, the cell array (e.g., CAR of FIGS. 1A and 1B) of the semiconductor device may include a cell region Cell_R and a contact region CT_R. In the cell region Cell_R, a plurality of pillar structures P may be regularly arranged. At both ends of the cell region Cell_R, vertical structures VS may be arranged. The plurality of pillar structures P may be arranged between the vertical structures VS. Each of the plurality of pillar structures P may include a channel layer CH and a memory layer ML enclosing the channel layer CH. Each vertical structure VS may be formed of an insulating layer, for example, an oxide layer.

Each of the pillar structures P may include a pair of a first pillar structure P1 and a second pillar structure P2. By the corresponding cutting structure CS, the pillar structure P may be separated into the first pillar structure P1 and the second pillar structure P2 forming one pair. The first pillar structure P1 and the second pillar structure P2 forming one pair may neighbor each other with the cutting structure CS interposed therebetween, and may have a symmetric structure with respect to the cutting structure CS.

In an embodiment, the pillar structures P may be cell plugs. The first pillar structure P1 may be a first cell plug, and the second pillar structure P2 may be a second cell plug.

The semiconductor device may further include an interlayer insulating layer IL disposed over a substrate SUB, etch stop layers ESL disposed in the interlayer insulating layer IL, a source layer SL and a buffer layer BUF disposed on the interlayer insulating layer IL, a cell stacked body STa disposed on the source layer SL, a dummy stacked body STb disposed on the buffer layer BUF, a first pillar structure P1 and a second pillar structure P2 configured to penetrate the cell stacked body STa and then extend into the source layer SL, cutting structures CS disposed between the first pillar structure P1 and the second pillar structure P2, and contact plugs CT configured to penetrate the dummy stacked body STb, the buffer layer BUF, and the interlayer insulating layer IL.

The substrate SUB may be made of the same material as the substrate SUB, described above with reference to FIGS. 1A and 1B. Conductive dopants defining a well region may be implanted into the substrate SUB. The conductive dopants defining the well region may be n-type or p-type impurities. The well region in the substrate SUB may be divided into active regions ACT1 and ACT2 separated by isolation layers ISO. The isolation layers ISO may include an insulating material embedded in the substrate SUB. The active regions ACT1 and ACT2 may include the first active region ACT1 which overlaps the dummy stacked body STb and the second active region ACT2 which overlaps the cell stacked body STa.

The source layer SL may be disposed to be spaced apart from the substrate SUB through a peripheral circuit structure PC and a peripheral circuit structure insulating layer LIL.

The peripheral circuit structure PC may include transistors TR. As illustrated in FIG. 2, the transistor TR may include a peripheral gate insulating layer disposed in the first active region ACT1 and the second active region ACT2, a peripheral gate electrode disposed on the peripheral gate insulating layer, and first to fourth junctions Jn1 to Jn4 disposed in the first and second active regions ACT1 and ACT2 on both sides of the peripheral gate electrode. The first and second junctions Jn1 and Jn2 may be regions defined by injecting n-type or p-type impurities into the second active region ACT2, one being usable as a source junction and the other being usable as a drain junction. The third and fourth junctions Jn3 and Jn4 may be regions defined by injecting n-type or p-type impurities into the first active region ACT1, one being usable as a source junction and the other being usable as a drain junction.

The peripheral circuit structure PC may include peripheral circuit lines PCL and peripheral contact plugs PCT, which are coupled to the transistor TR. The peripheral circuit structure PC may include a resistor, a capacitor, etc. in addition to the transistor TR and the peripheral circuit lines PCL and the peripheral contact plugs PCT coupled to the transistor TR.

The above-described peripheral circuit structure PC may be covered with the peripheral circuit structure insulating layer LIL disposed between the source layer SL and the substrate SUB. The peripheral circuit structure insulating layer LIL may include insulating layers stacked in a multi-layer structure.

An interlayer insulating layer IL may be disposed between the peripheral circuit structure insulating layer LIL and the source layer SL, and etch stop layers ESL may be disposed in the interlayer insulating layer IL. The etch stop layers ESL may correspond to the cutting structures CS, respectively, and may overlap the respective cutting structures CS in a vertical direction (i.e., the stacking direction or, for example, the direction of the stacking of the peripheral circuit structure insulating layer LIL with the interlayer insulating layer IL and then the source layer SL as shown in FIG. 3B). The etch stop layers ESL may prevent or mitigate even the peripheral circuit structure PC from being etched during an etching process of forming the cutting structures CS which penetrate the first pillar structure P1 and the second pillar structure P2.

The source layer SL may be disposed on the interlayer insulating layer IL. The source layer SL may include two or more semiconductor layers L1, L2, and L3.

For example, the source layer SL may include first to third semiconductor layers L1 to L3 that are sequentially stacked on the interlayer insulating layer IL. Each of the first and second semiconductor layers L1 and L2 may be a doped semiconductor layer including source dopants. In an embodiment, each of the first and second semiconductor layers L1 and L2 may include a doped silicon layer including n-type impurities. The third semiconductor layer L3 may be omitted in some cases. The third semiconductor layer L3 may include at least one of an n-type doped silicon layer and an undoped silicon layer. The source layer SL may be disposed in the cell region Cell_R of FIG. 3A.

The buffer layer BUF may be disposed in the contact region CT_R of FIG. 3A. The buffer layer BUF may be disposed on the interlayer insulating layer IL in the contact region CT_R, and the height of the uppermost portion (top surface) of the buffer layer BUF may be equal to that of the uppermost portion (top surface) of the source layer SL.

The cell stacked body STa may be formed in the cell region Cell_R, and may include cell interlayer insulating layers ILDc and conductive patterns CP1 to CPn (where n is a natural number equal to or greater than 2), which are alternately stacked on the source layer SL. The cell stacked body STa may be disposed at the same level as the dummy stacked body STb. For example, each of the cell interlayer insulating layers ILDc may include a silicon oxide. Each of the conductive patterns CP1 to CPn may include various conductive materials, such as a doped silicon layer, a metal layer and a metal silicide layer, and a barrier layer, and may include two or more types of conductive materials. For example, each of the conductive patterns CP1 to CPn may include tungsten and a titanium nitride layer (TiN) configured to enclose the surface of tungsten. Tungsten may be low-resistance metal, and may decrease the resistance of the conductive patterns CP1 to CPn. The titanium nitride layer (TiN) may be a barrier layer, and may prevent or mitigate tungsten and the cell interlayer insulating layers ILDc from directly contacting each other.

The conductive patterns CP1 to CPn may be used as gate electrodes of a cell string. The gate electrodes of the cell string may include source select lines, word lines, and drain select lines. The source select lines may be used as gate electrodes of source select transistors, the drain select lines may be used as gate electrodes of drain select transistors, and the word lines may be used as gate electrodes of memory cells.

The cell stacked body STa may enclose the first pillar structure P1 and the second pillar structure P2. That is, the first pillar structure P1 and the second pillar structure P2 may penetrate portions of the cell stacked body STa and the source layer SL. The first pillar structure P1 and the second pillar structure P2 forming one pair may be separated from each other by the corresponding cutting structure CS. The first pillar structure P1 and the second pillar structure P2 forming one pair may neighbor each other with the cutting structure CS interposed therebetween, and may have a symmetric structure with respect to the cutting structure CS.

In an embodiment, first memory cells or select transistors may be disposed at positions at which the first pillar structure P1 and the conductive patterns CP1 to CPn intersect, and second memory cells or select transistors may be disposed at positions at which the second pillar structure P2 and the conductive patterns CP1 to CPn intersect. The first and second memory cells neighboring each other with the cutting structure CS interposed therebetween may be individually driven.

The first pillar structure P1 may include a first channel layer CH_A. The first channel layer CH_A may be an area in which channels such as for memory cells or select transistors are formed. The first channel layer CH_A may include a semiconductor material such as silicon or germanium. The first pillar structure P1 may further include a first capping layer CA_A. The first capping layer CA_A may be coupled to the first channel layer CH_A, and may include a conductive material. The first pillar structure P1 may further include a first insulating core CO_A. The first insulating core CO_A may include an insulating material such as an oxide, a nitride or an air gap. The first pillar structure P1 may further include a first memory layer ML_A disposed between the first channel layer CH_A and the conductive patterns CP1 to CPn. The first memory layer ML_A may include at least one of a tunneling layer, a data storage layer, and a blocking layer. The data storage layer may include a floating gate, a charge trap material, polysilicon, a nitride, a variable resistance material, or a nanostructured material, or a combination thereof.

The second pillar structure P2 may have a structure similar to that of the first pillar structure P1. The second pillar structure P2 may include a second channel layer CH_B. The second pillar structure P2 may further include a second capping layer CA_B, a second insulating layer CO_B, or a second memory layer ML_B, or may further include a combination thereof.

The cutting structure CS may penetrate the first pillar structure P1 and the second pillar structure P2 forming one pair, and may extend to the corresponding etch stop layer ESL. The cutting structure CS may penetrate the cell stacked body STa, the first pillar structure P1, and the second pillar structure P2, and may extend in a vertical direction. The cutting structure CS may successively penetrate at least two pairs of the first pillar structure P1 and the second pillar structure P2. The cutting structure CS may include an insulating material such as an oxide, a nitride or an air gap.

The dummy stacked body STb may be formed on the buffer layer BUF in the contact region CT_R, and may enclose the contact plugs CT. The dummy stacked body STb may include the same constituent materials as the cell stacked body STa, that is, the cell interlayer insulating layers ILDc and the conductive patterns CP1 to CPn, which are alternately stacked. In an embodiment, the dummy stacked body STb may further include cell interlayer insulating layers ILDc and sacrificial layers, which are alternately stacked.

Each contact plug CT may penetrate the dummy stacked body STb, the buffer layer BUF, and the interlayer insulating layer IL, and may then extend to the peripheral circuit structure PC. The contact plug CT may be directly coupled to the peripheral circuit lines PCL of the peripheral circuit structure PC. The contact plug CT may include a conductive pattern CON and a barrier layer BA enclosing a sidewall of the conductive pattern CON.

FIGS. 4A to 4H are views illustrating a method of manufacturing a semiconductor device according to an embodiment of the present disclosure.

Figure 4A:
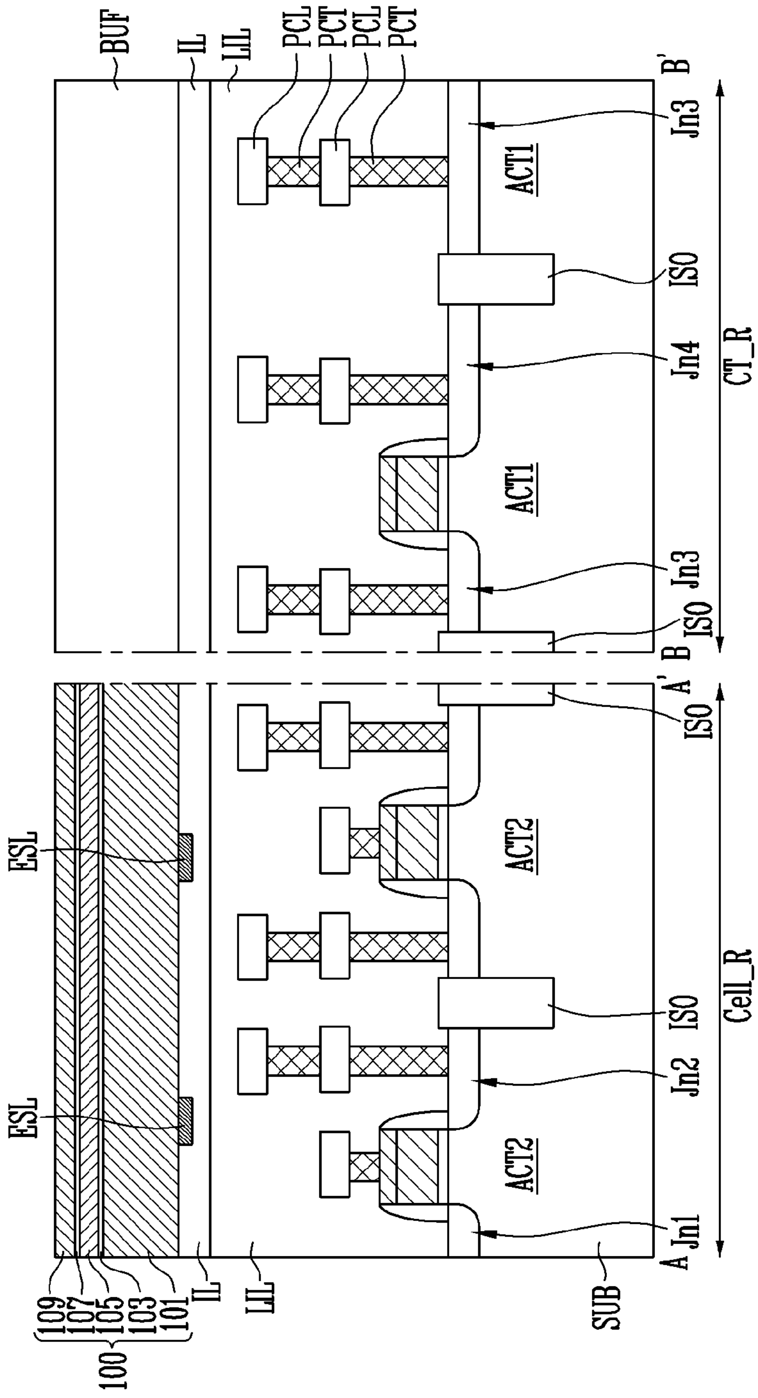
FIGS. 4A, 4B, 4C, 4D, 4E, 4F, 4G, and 4H are views illustrating a method of manufacturing a semiconductor device according to an embodiment of the present disclosure.

Referring to FIG. 4A, a peripheral circuit structure may be formed on a substrate including active regions ACT1 and ACT2 separated by isolation layers ISO.

The active regions ACT1 and ACT2 may include a first active region ACT1 and a second active region ACT2. The first active region ACT1 may include junctions Jn3 and Jn4, and the second active region ACT2 may include junctions Jn3 and Jn2. A region overlapping the first active region ACT1 may be defined as a contact region CT_R, and a region overlapping the second active region ACT2 may be defined as a cell region Cell_R.

Because the isolation layers ISO, the active regions ACT1 and ACT2, the junctions Jn1, Jn2, Jn3, and Jn4, peripheral circuit lines PCL and peripheral contact plugs PCT included in the peripheral circuit structure, and a peripheral circuit structure insulating layer LIL have been described in detail with reference to FIG. 3B, repeated descriptions thereof will be omitted.

Then, an interlayer insulating layer IL may be formed on the peripheral circuit structure insulating layer LIL, and etch stop layers ESL may be formed in the interlayer insulating layer IL. The etch stop layers ESL may be disposed in the cell region Cell_R to overlap the cell region Cell_R, more specifically, disposed under cutting structures, which will be subsequently formed, to overlap the cutting structures.

Next, a lower stacked body 100 may be formed on the interlayer insulating layer IL in the cell region Cell_R. The lower stacked body 100 may include a lower semiconductor layer 101, a sacrificial layer 105, and an upper semiconductor layer 109, which are sequentially stacked. Before the sacrificial layer 105 is deposited on the lower semiconductor layer 101, a first protective layer 103 may be formed on the lower semiconductor layer 101. Before the upper semiconductor layer 109 is formed over the lower semiconductor layer 101 or the first protective layer 103, a second protective layer 107 may be formed over the lower semiconductor layer 101 or the first protective layer 103.

The lower semiconductor layer 101 may include a doped semiconductor layer containing conductive impurities. For example, the lower semiconductor layer 101 may include an n-type doped silicon layer. The sacrificial layer 105 may include a material having an etching rate different from those of the first protective layer 103 and the second protective layer 107, and each of the first protective layer 103 and the second protective layer 107 may include a material having an etching rate different from those of the lower semiconductor layer 101 and the upper semiconductor layer 109. For example, the sacrificial layer 105 may include an undoped silicon layer, and each of the first protective layer 103 and the second protective layer 107 may include an oxide layer. The upper semiconductor layer 109 may include a semiconductor layer. For example, the upper semiconductor layer 109 may include a doped silicon layer or an undoped silicon layer.

Next, a buffer layer BUF may be formed on the interlayer insulating layer IL in the contact region CT_R. The height of the surface of the uppermost portion of the buffer layer BUF may be equal to that of the surface of the uppermost portion of the lower stacked body 100 formed in the cell region Cell_R. The buffer layer BUF may include an oxide. The buffer layer BUF may include the same material as the interlayer insulating layer IL.

Figure 4B:
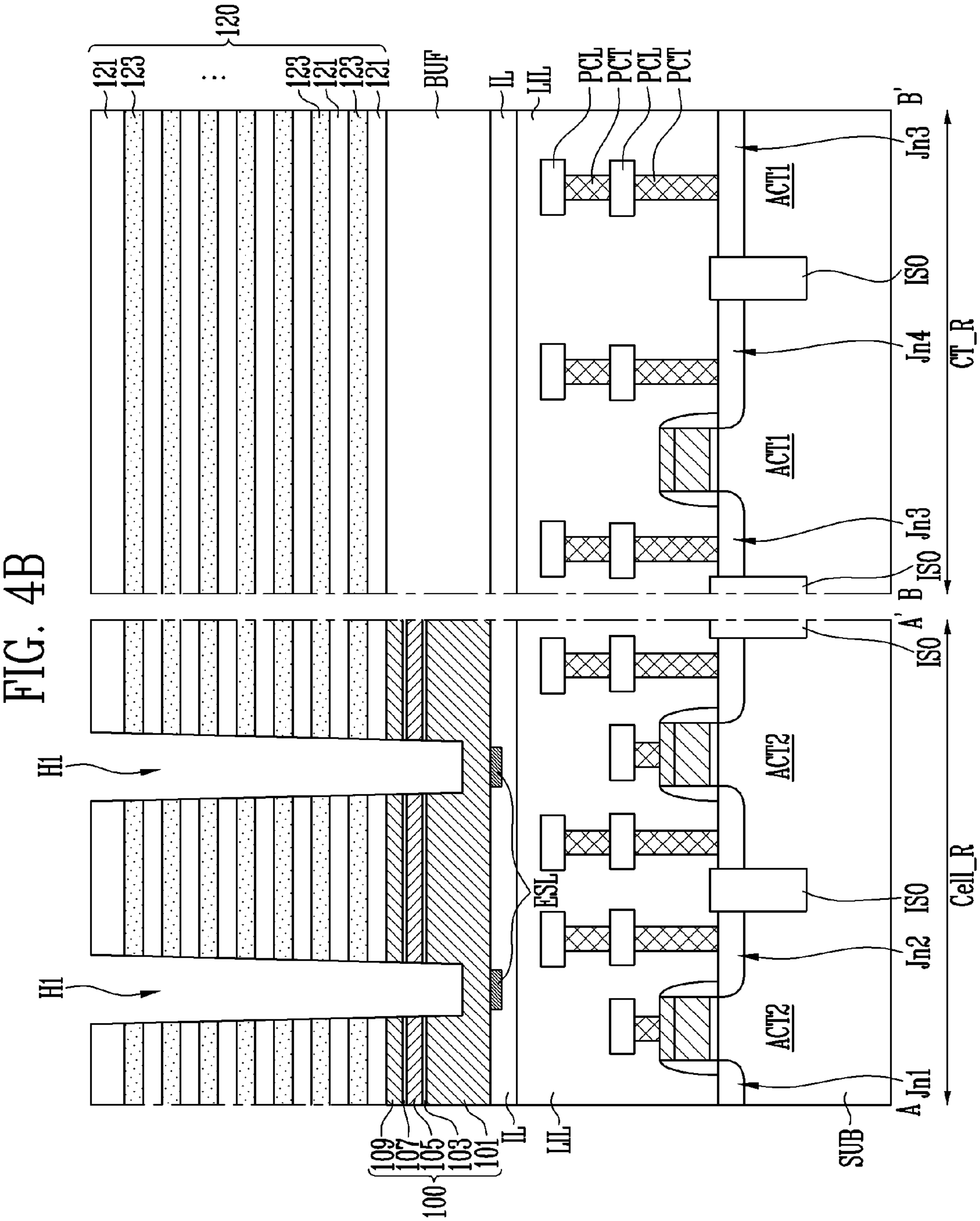

Referring to FIG. 4B, an upper stacked body 120 may be formed on the lower stacked body 100 in the cell region Cell_R and on the buffer layer BUF in the contact region CT_R. The upper stacked body 120 may include first material layers 121 and second material layers 123, which are alternately stacked. The first material layers 121 may include a material different from that of the second material layers 123. In an embodiment, the first material layers 121 may include an insulating material, and the second material layers 123 may include a sacrificial insulating material having an etching rate different from that of the first material layers 121. For example, each of the first material layers 121 may include a silicon oxide, and each of the second material layers 123 may include a silicon nitride.

Thereafter, first holes H1 passing through the upper stacked body 120 and then extending into the lower stacked body 100 are formed. The first holes H1 may overlap the etch stop layers ESL. The first holes H1 may be formed such that the interlayer insulating layer IL is not exposed. The first holes H1 may be desirably formed to extend into the lower stacked body 100, but not to pass through the lower stacked body 100. For example, the first holes H1 may sequentially pass through the upper stacked body 120, and the upper semiconductor layer 109, the second protective layer 107, the sacrificial layer 105, and the first protective layer 103 of the lower stacked body 100.

Figure 4C:
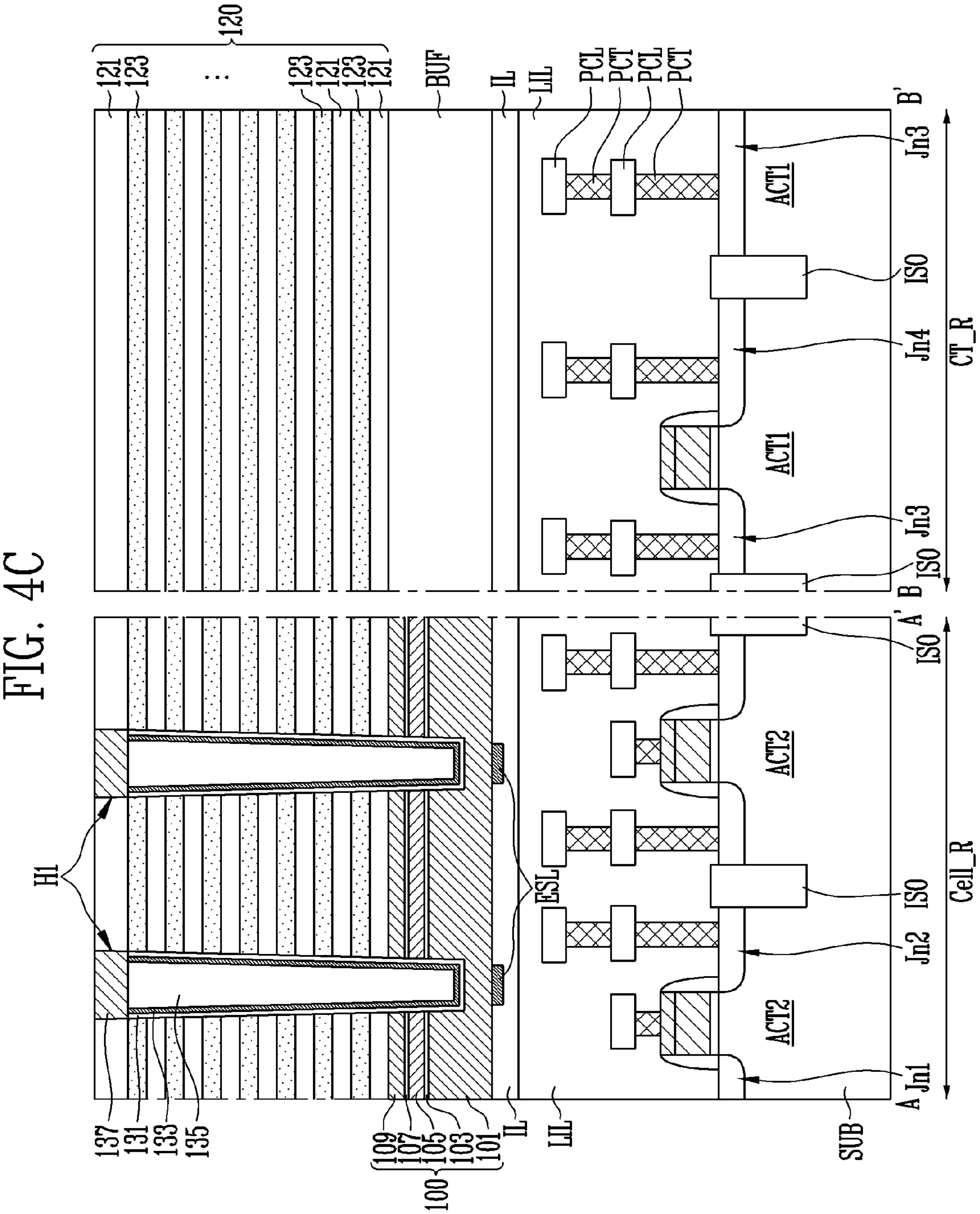

Referring to FIG. 4C, a plurality of pillar structures 131, 133, 135, and 137 may be formed in each of the first holes H1.

For example, a memory layer 131 is formed on the sidewall and the bottom surface of each of the first holes H1. The memory layer 131 may include at least one of a tunneling layer, a data storage layer, and a blocking layer. The data storage layer may include a floating gate, a charge trap material, polysilicon, a nitride, a variable resistance material, or a nanostructured material, or a combination thereof. Thereafter, a channel layer 133 may be formed along the surface of the memory layer 131. The channel layer 133 may include a semiconductor material such as silicon or germanium. Thereafter, a core insulating layer 135 may be formed such that a central portion of each first hole H1 is fully covered. The core insulating layer 135 may include an oxide. Thereafter, upper portions of the memory layer 131, the channel layer 133, and the core insulating layer 135 may be etched, and a capping layer 137 may be formed in areas from which the memory layer 131, the channel layer 133, and the core insulating layer 135 are etched. The capping layer 137 may include a conductive material, and may be directly coupled to the channel layer 133. The height of the bottom surface of the capping layer 137 may be greater than that of the top surface of the second material layer 123 disposed in the uppermost portion, among the plurality of second material layers 123.

Figure 4D:
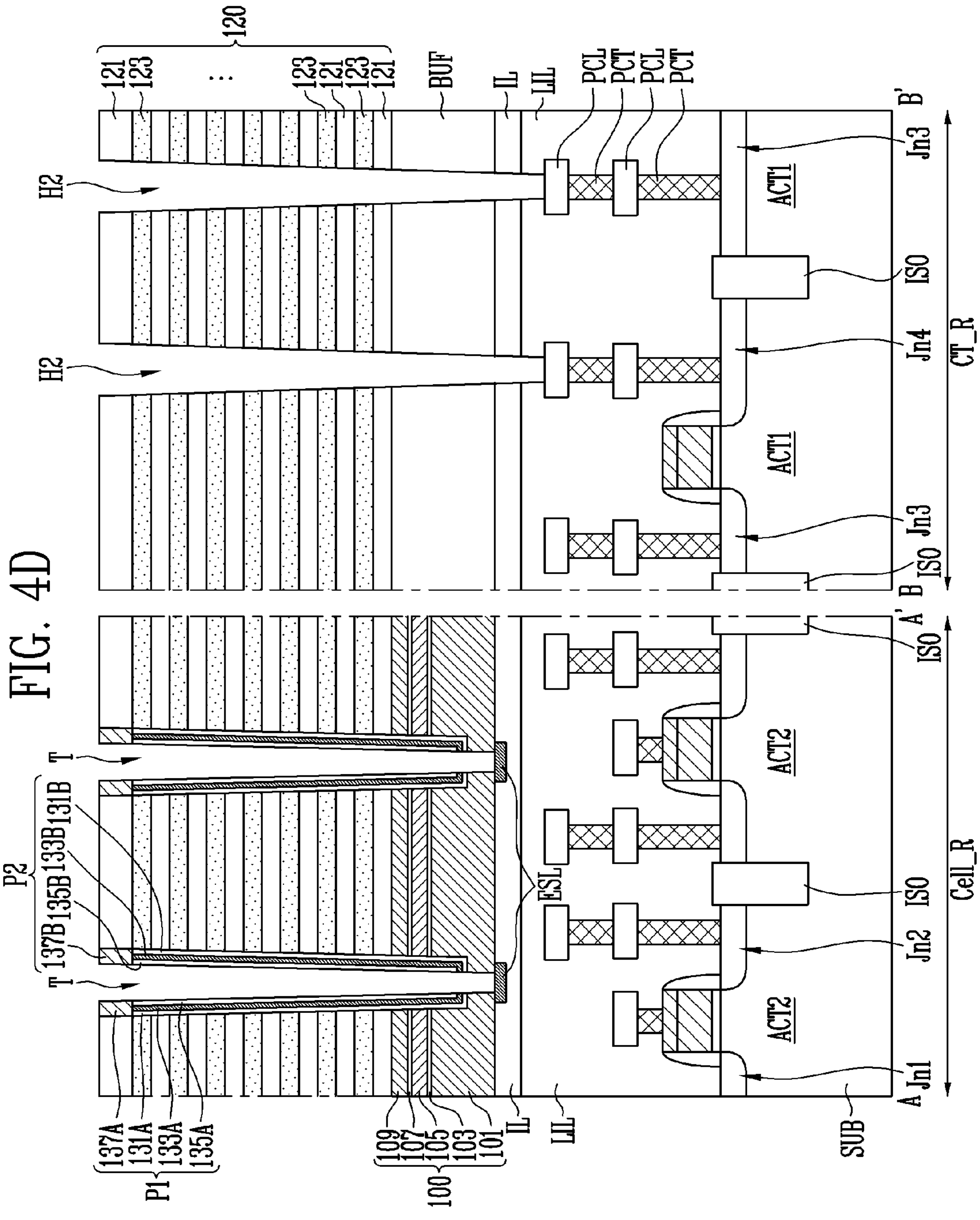

Referring to FIG. 4D, trenches T passing through one or more pillar structures may be formed. Each of the trenches T may extend in a horizontal direction parallel to the upper surface of the substrate SUB. Each of the one or more pillar structures may be separated into a first pillar structure P1 and a second pillar structure P2 by the corresponding trench T. The trench T may pass through the one or more pillar structures, the upper stacked body 120, and the lower stacked body 100. The trench T may expose the corresponding etch stop layer ESL. The etch stop layer ESL may prevent or mitigate the trench T from extending to the interlayer insulating layer IL and the peripheral circuit structure insulating layer LIL during an etching process of forming the trench T. That is, in an embodiment, the etch stop layers ESL may prevent or mitigate the peripheral circuit structure from being damaged during the etching process of forming the trench T.

The first pillar structure P1 may be a first cell plug, and the second pillar structure P2 may be a second cell plug. The first pillar structure P1 may include a first memory layer 131A, a first channel layer 133A, a first core insulating layer 135A, and a first capping layer 137A. The second pillar structure P2 may include a second memory layer 131B, a second channel layer 133B, a second core insulating layer 135B, and a second capping layer 137B.

During the etching process of forming the trenches T, second holes H2 for exposing the peripheral circuit lines PCL in the contact region CT_R may be formed together with the trenches. For example, during the etching process of forming the trenches T, the upper stacked body 120, the buffer layer BUF, the interlayer insulating layer IL, and the peripheral circuit structure insulating layer LIL, which are formed in the contact region CT_R, are etched together, and thus second holes H2 for exposing the peripheral circuit lines PCL are formed together with the trenches T. In an embodiment, during the etching process of forming the trenches T, second holes H2 for exposing the peripheral circuit lines PCL in the contact region CT_R may be formed simultaneously with the trenches. For example, if an etching process for the trenches T takes place over a first interval of time and an etching process for the holes H2 takes place simultaneously over a second interval of time, then the first and second intervals at least partially overlap each other such that there exists a time at which the etching process for the trenches T and the etching process for the holes H2 are both taking place. In an embodiment, the trenches T may be formed simultaneously with the second holes H2. The word "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place. In an embodiment, forming the trenches T and the second holes H2 includes performing together a trench formation etching process of etching the pillar structures (i.e., P1 and P2) such that the etch stop layer ESL is exposed, and second hole formation etching process of etching the upper stacked body 120, the buffer layer BUF, and the interlayer insulating layer IL in the contact region CT_R such that a peripheral circuit line PCL included in the peripheral circuit structure PC in the contact region CT_R is exposed.

Figure 4E:
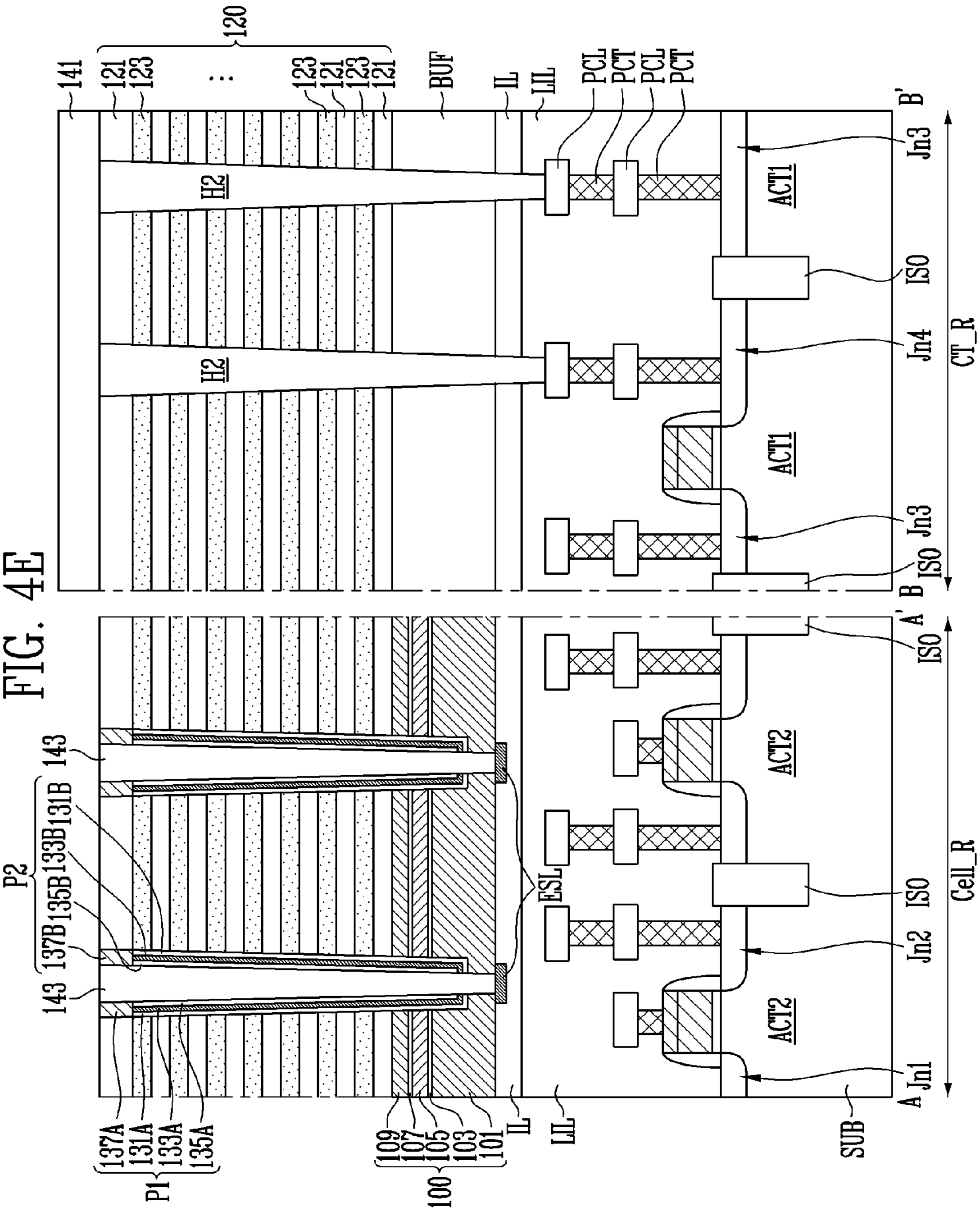

Referring to FIG. 4E, a mask pattern 141 for covering the second holes H2 is formed on the upper stacked body 120 in the contact region CT_R. Thereafter, cutting structures 143 are formed in the trenches (e.g., T of FIG. 4D) formed in the cell region Cell_R. For example, the cutting structures 143 may be formed by filling the trenches (e.g., T of FIG. 4D) formed in the cell region Cell_R with an insulating material.

In other embodiments, the cutting structures 143 may be formed by selectively removing the etch stop layers ESL exposed through the trenches (e.g., T of FIG. 4D), and filling spaces, from which the etch stop layers ESL are removed, and the trenches (e.g., T of FIG. 4D) with an insulating material. In this case, each of the cutting structures 143 may extend into the interlayer insulating layer IL, and the cutting structures 143 formed in the interlayer insulating layer IL and the lower stacked body 100 may have a bottleneck structure.

Figure 4F:
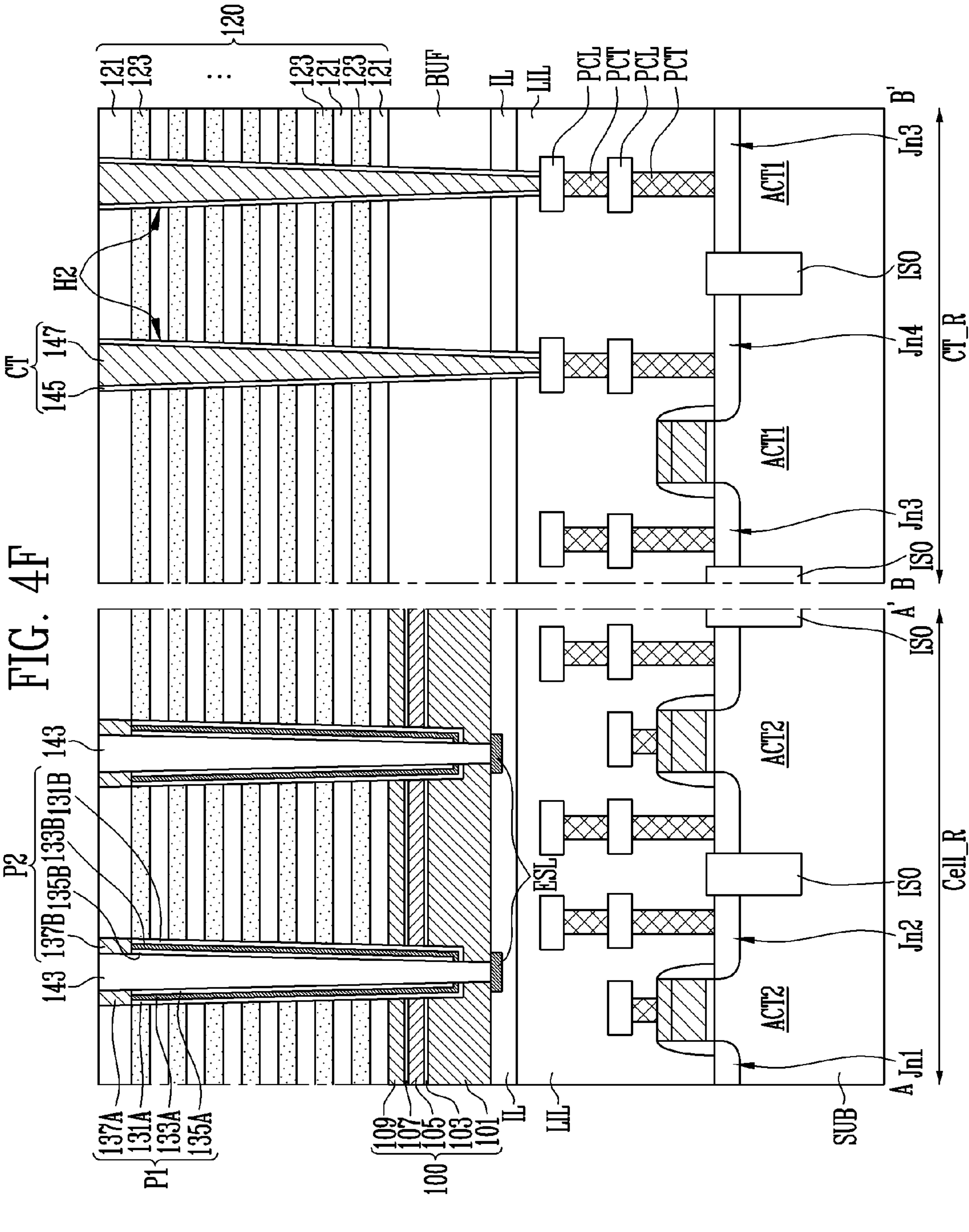

Referring to FIG. 4F, the second holes H2 are opened by removing the mask pattern (e.g., 141 of FIG. 4E) formed in the contact region CT_R, and contact plugs CT are formed in the second holes H2. For example, a barrier layer 145 is formed on the sidewall of each of the second holes H2, after which the central portion of the second hole H2 is filled with a conductive layer 147, and thus the corresponding contact plug CT is formed.

Figure 4G:
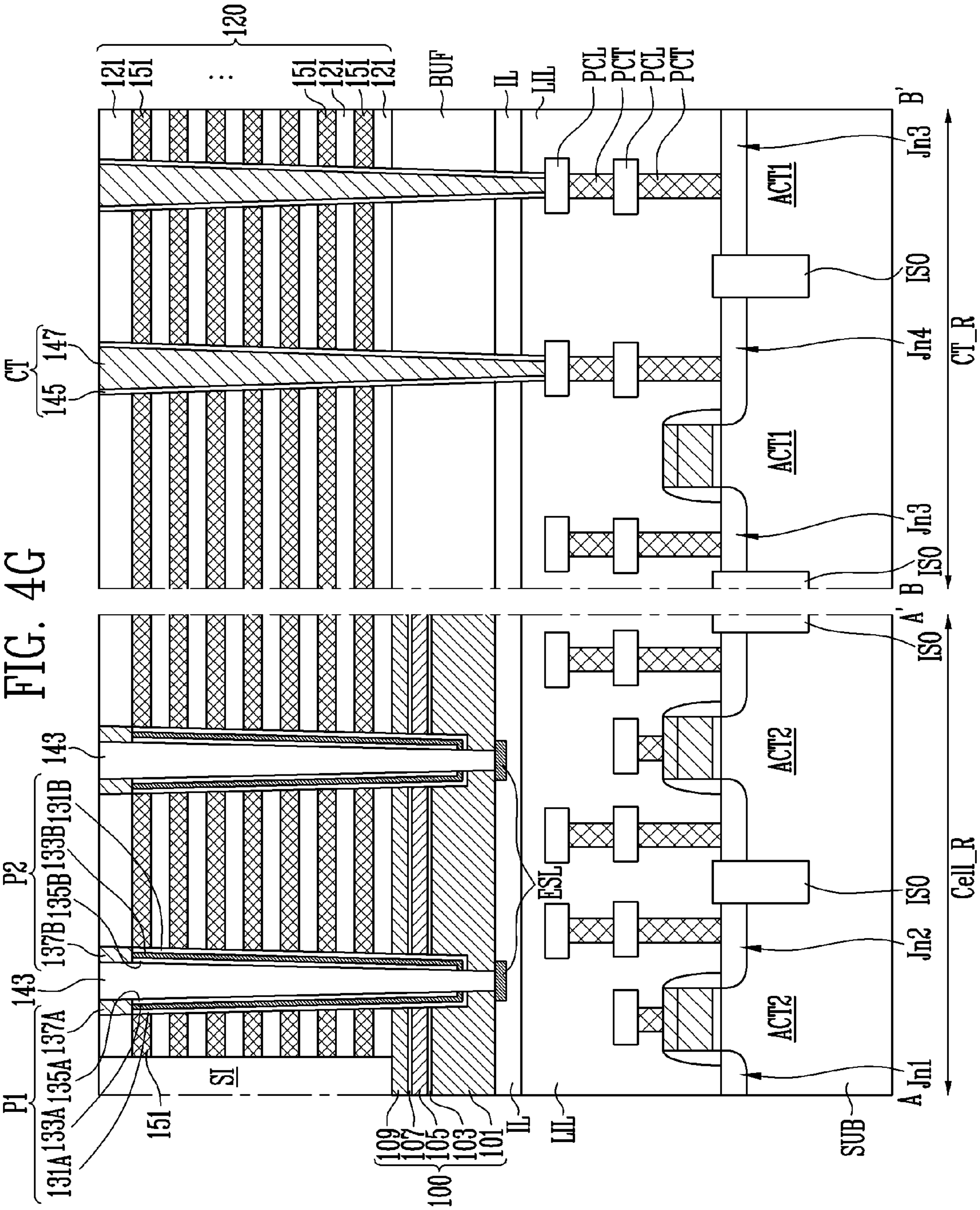

Referring to FIG. 4G, a slit SI passing through the upper stacked body 120 in the cell region Cell_R is formed, and thus the sidewalls of the second material layers (e.g., 123 of FIG. 4F) of the upper stacked body 120 are exposed. Thereafter, conductive patterns 151 are formed by removing the exposed second material layers (e.g., 123 of FIG. 4F) and filling areas, from which the second material layers (e.g., 123 of FIG. 4F) are removed, with a conductive material.

In an embodiment, during a process of replacing the second material layers (e.g., 123 of FIG. 4F) included in the upper stacked body 120 in the cell region Cell_R with the conductive patterns 151, the second material layers (e.g., 123 of FIG. 4F) included in the upper stacked body 120 in the contact region CT_R may also be replaced with the conductive patterns 151. In other embodiments, during the process of replacing the second material layers (e.g., 123 of FIG. 4F) included in the upper stacked body 120 in the cell region Cell_R with the conductive patterns 151, the second material layers (e.g., 123 of FIG. 4F) included in the upper stacked body 120 in the contact region CT_R may remain.

Figure 4H:
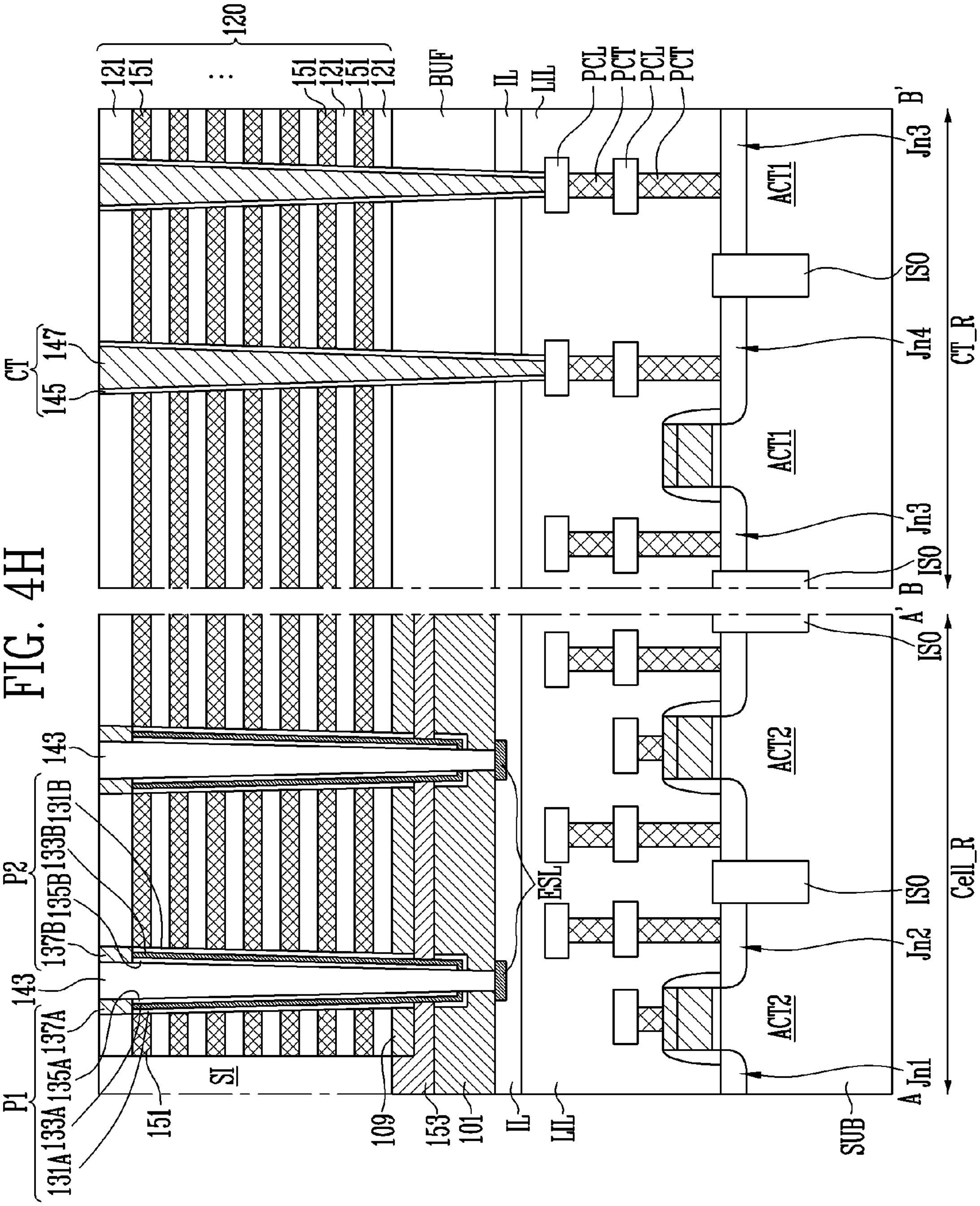

Referring to FIG. 4H, the sacrificial layer (e.g., 105 of FIG. 4G) in the cell region is exposed by etching the upper semiconductor layer 109 and the second protective layer (e.g., 107 of FIG. 4G) exposed through the slit, and thus a horizontal space is formed.

Thereafter, the exposed sacrificial layer (e.g., 105 of FIG. 4G) is removed. During the process of removing the sacrificial layer (e.g., 105 of FIG. 4G), the first protective layer (e.g., 103 of FIG. 4G) and the second protective layer (e.g., 107 of FIG. 4G) may prevent or mitigate the upper semiconductor layer 109 and the lower semiconductor layer 101 from being damaged.

Thereafter, the first channel layer 133A and the second channel layer 1338 are exposed by etching portions of the first memory layer 131A and the second memory layer 1318, exposed through the horizontal space. During the process of etching the first memory layer 131A and the second memory layer 1318, the first protective layer and the second protective layer may be removed together.

Thereafter, a source semiconductor layer 153 is formed by introducing a conductive material into the horizontal space through the slit SI. The source semiconductor layer 153 may commonly contact the sidewalls of the first channel layer 133A and the second channel layer 133B, the lower semiconductor layer 101, and the upper semiconductor layer 109. The source semiconductor layer 153 may be formed using a chemical vapor deposition method or may be formed using a growth method which exploits the first channel layer 133A, the second channel layer 133B, the lower semiconductor layer 101, and the upper semiconductor layer 109 as respective seed layers. The source semiconductor layer 153 may include conductive dopants. For example, the source semiconductor layer 153 may include an n-type doped silicon layer. The conductive dopants in the source semiconductor layer 153 may be thermally diffused to the upper semiconductor layer 109, the first channel layer 133A, and the second channel layer 133B which contact the source semiconductor layer 153.

Figure 5:
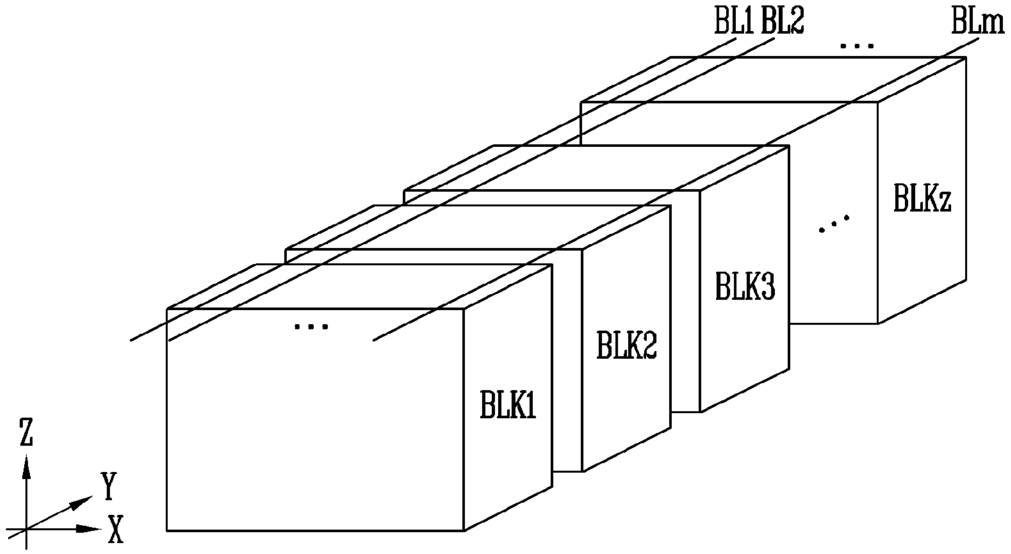
FIG. 5 is a diagram illustrating memory blocks included in a semiconductor device according to an embodiment of the present disclosure.

FIG. 5 is a diagram illustrating memory blocks included in a semiconductor device according to an embodiment of the present disclosure.

The semiconductor device may include a plurality of memory blocks BK1 to BLKz. The plurality of memory blocks BLK1 to BLKz may be arranged to be spaced apart from each other in a direction Y in which bit lines BL1 to BLm extend. For example, the first to z-th memory blocks BLK1 to BLKz may be arranged to be spaced apart from each other in a second direction Y, and each of the first to z-th memory blocks BLK1 to BLKz may include a plurality of memory cells stacked in a third direction Z. Here, the first to z-th memory blocks BLK1 to BLKz may be spaced apart from each other using a slit.

Figure 6:
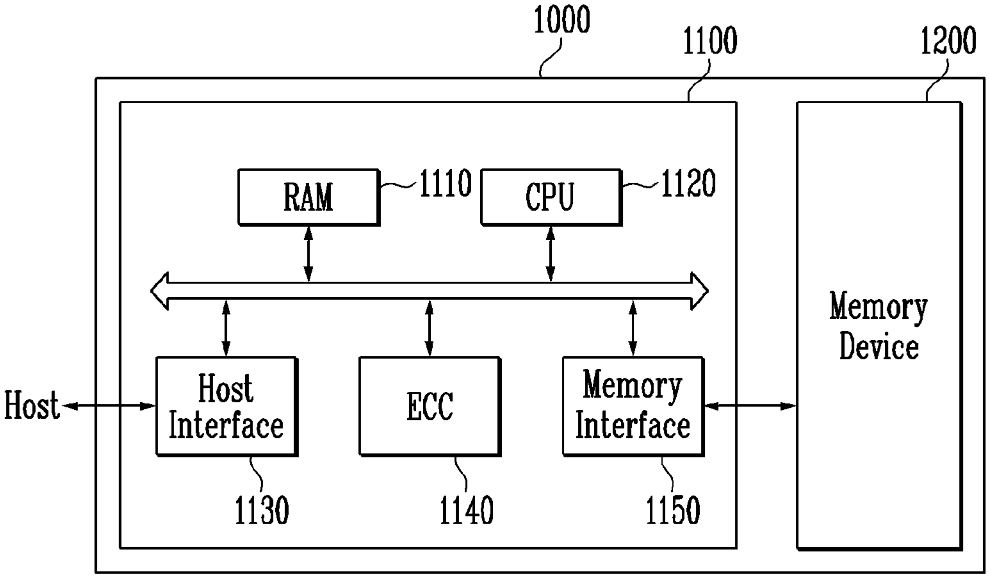
FIG. 6 is a block diagram illustrating the configuration of a memory system according to an embodiment of the present disclosure.

FIG. 6 is a block diagram illustrating the configuration of a memory system according to an embodiment of the present disclosure.

Referring FIG. 6, a memory system 1000 according to an embodiment of the present disclosure includes a memory device 1200 and a controller 1100.

The memory device 1200 is used to store data information having a variety of data forms such as text data, graphics data, and software codes. The memory device 1200 may be the semiconductor device, described above with reference to FIGS. 3A and 3B, and may be manufactured based on the manufacturing method, described above with reference to FIGS. 4A to 4H. Since the structure of the memory device 1200 and the method of manufacturing the memory device 1200 are the same as those described above, detailed descriptions thereof will be omitted.

The controller 1100 may be coupled to a host and the memory device 1200, and may access the memory device 1200 in response to a request received from the host. For example, the controller 1100 may control read, write, erase, and background operations of the memory device 1200.

The controller 1100 includes a random access memory (RAM) 1110, a central processing unit (CPU) 1120, a host interface 1130, an error correction code (ECC) circuit 1140, a memory interface 1150, etc.

Here, the RAM 1110 can be used as a working memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control the overall operation of the controller 1100. For example, the CPU 1120 may run firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (PATA) protocol, a small computer system interface (SCSI) protocol, an enhanced small disk interface (ESDI) protocol, an integrated drive electronics (IDE) protocol, and a private protocol.

The ECC circuit 1140 uses an error correction code (ECC) to detect and correct errors in data read from the memory device 1200.

The memory interface 1150 may interface with the memory device 1200. For example, the memory interface 1150 includes a NAND interface or a NOR interface.

For reference, the controller 1100 may further include a buffer memory (not illustrated) for storing data. Here, the buffer memory may be used to store data to be transferred to an external device through the host interface 1130 or data transferred from the memory device 1200 through the memory interface 1150. The controller 1100 may further include a ROM which stores code data required to interface with the host.

As described above, since the memory system 1000 according to an embodiment of the present disclosure includes the memory device 1200 having an improved integration degree and improved characteristics, the integration degree and characteristics of the memory system 1000 may also be improved.

Figure 7:
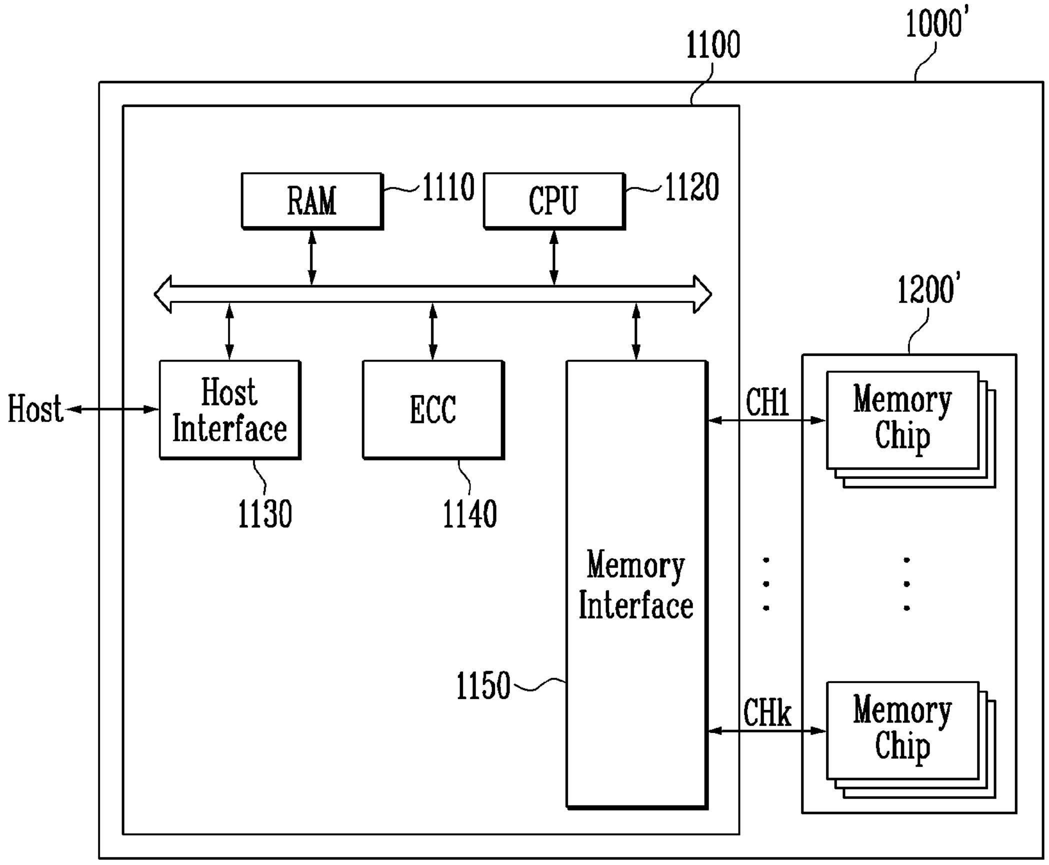
FIG. 7 is a block diagram illustrating the configuration of a memory system according to an embodiment of the present disclosure.

FIG. 7 is a block diagram illustrating the configuration of a memory system according to an embodiment of the present disclosure. Below, repetitive descriptions identical to the above descriptions will be omitted.

Referring FIG. 7, a memory system 1000' according to an embodiment of the present disclosure includes a memory device 1200' and a controller 1100. Also, the controller 1100 includes a RAM 1110, a CPU 1120, a host interface 1130, an ECC circuit 1140, a memory interface 1150, etc.

The memory device 1200' may be a nonvolatile memory, may be the semiconductor device, described above with reference to FIGS. 3A and 3B, and may be manufactured based on the manufacturing method, described above with reference to FIGS. 4A to 4H. Since the structure of the memory device 1200' and the method of manufacturing the memory device 1200' are the same as those described above, detailed descriptions thereof will be omitted.

Further, the memory device 1200' may be a multi-chip package composed of a plurality of memory chips. The plurality of memory chips may be divided into a plurality of groups. The plurality of groups may communicate with the controller 1100 through first to k-th channels CH1 to CHk. Furthermore, the memory chips belonging to one group may communicate with the controller 1100 through a common channel. For reference, the memory system 1000' may be modified such that one memory chip is coupled to one channel.

As described above, since the memory system 1000' according to an embodiment of the present disclosure includes the memory device 1200' having an improved integration degree and improved characteristics, the integration degree and characteristics of the memory system 1000' may also be improved. In particular, in an embodiment, the memory device 1200' is configured in a multi-chip package, whereby the data storage capacity of the memory system 1000' may be increased, and the operating speed thereof may be enhanced.

Figure 8:
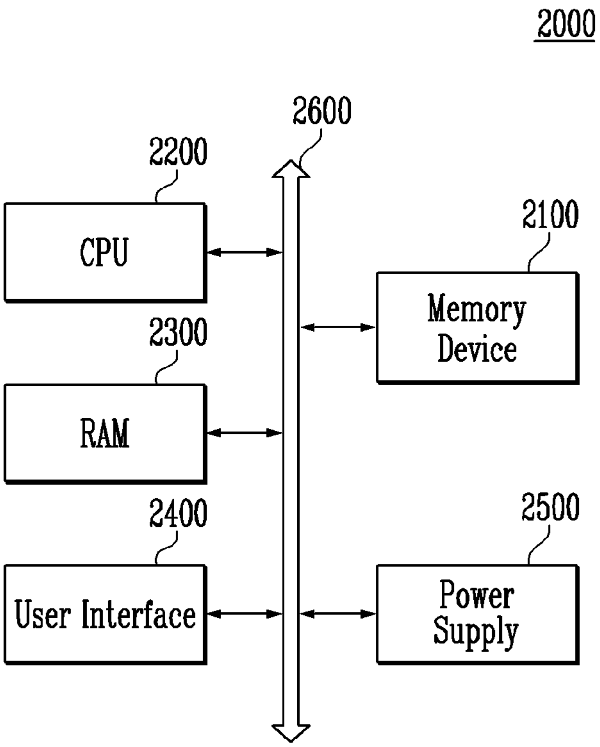
FIG. 8 is a block diagram illustrating the configuration of a computing system according to an embodiment of the present disclosure.

FIG. 8 is a block diagram illustrating the configuration of a computing system according to an embodiment of the present disclosure. Below, repetitive descriptions identical to the above descriptions will be omitted.

Referring to FIG. 8, a computing system 2000 according to an embodiment of the present disclosure includes a memory device 2100, a CPU 2200, a RAM 2300, a user interface 2400, a power supply 2500, a system bus 2600, etc.

The memory device 2100 stores data provided via the user interface 2400, data processed by the CPU 2200, etc. Further, the memory device 2100 is electrically connected to the CPU 2200, the RAM 2300, the user interface 2400, the power supply 2500, etc. through the system bus 2600. For example, the memory device 2100 may be coupled to the system bus 2600 either through a controller (not illustrated) or directly. In the case where the memory device 2100 is directly coupled to the system bus 2600, the function of the controller may be performed by the CPU 2200, the RAM 2300, etc.

Here, the memory device 2100 may be a nonvolatile memory, may be the semiconductor device, described above with reference to FIGS. 3A and 3B, and may be manufactured based on the manufacturing method, described above with reference to FIGS. 4A to 4H. Since the structure of the memory device 2100 and the method of manufacturing the memory device 2100 are the same as those described above, detailed descriptions thereof will be omitted.

Furthermore, the memory device 2100 may be a multi-chip package composed of a plurality of memory chips, as described above with reference to FIG. 7.

The computing system 2000 having the above-mentioned configuration may be provided as one of various elements of an electronic device such as a computer, an ultra mobile PC (UMPC), a workstation, a net-book, a personal digital assistant (PDA), a portable computer, a web tablet, a wireless phone, a mobile phone, a smart phone, an electronic book (e-book), a portable multimedia player (PMP), a portable game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to an embodiment of the present disclosure includes the memory device 2100 having an improved integration degree and improved characteristics, the integration degree and characteristics of the computing system 2000 may also be improved.

Figure 9:
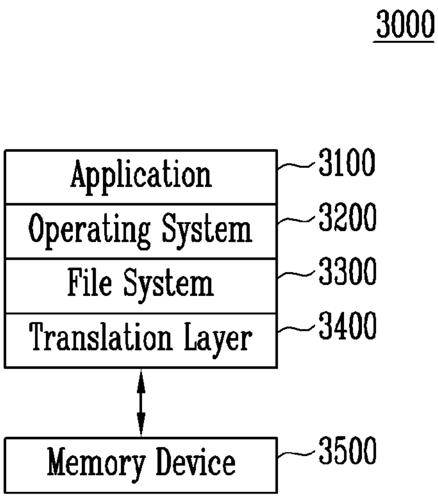
FIG. 9 is a block diagram illustrating a computing system according to an embodiment of the present disclosure.

FIG. 9 is a block diagram illustrating a computing system according to an embodiment of the present disclosure.

Referring to FIG. 9, a computing system 3000 according to an embodiment of the present disclosure includes a software layer which includes an operating system 3200, an application 3100, a file system 3300, a translation layer 3400, etc. Also, the computing system 3000 includes a hardware layer such as a memory device 3500.

The operating system 3200, which is configured to manage software resources, hardware resources, etc. of the computing system 3000, may control the execution of programs by the CPU. The application 3100 may be any of various applications to be executed in the computing system 3000, and may be a utility to be executed by the operating system 3200.

The file system 3300 may refer to a logical structure for controlling data, files, etc. which are present in the computing system 3000, and may organize files or data to be stored in the memory device 3500 based on rules. The file system 3300 may be determined depending on the operating system 3200 that is used in the computing system 3000. For example, if the operating system 3200 is a Microsoft Windows-based operating system, the file system 3300 may be a file allocation table (FAT), an NT file system (NTFS), or the like. Further, if the operating system 3200 is a Unix/Linux-based operating system, the file system 3300 may be an Extended File System (EXT), a Unix File System (UFS), a Journaling File System (JFS), or the like.

Although the operating system 3200, the application 3100, and the file system 3300 are illustrated as being separate blocks in the drawing, the application 3100 and the file system 3300 may be included in the operating system 3200.

The translation layer 3400 translates an address into a form suitable for the memory device 3500 in response to a request received from the file system 3300. For example, the translation layer 3400 translates a logical address generated by the file system 3300 into a physical address of the memory device 3500. Here, information about mapping between the logical address and the physical address may be stored in an address translation table. For example, the translation layer 3400 may be a flash translation layer (FTL), a universal flash storage link layer (ULL), or the like.

The memory device 3500 may be a nonvolatile memory, may be the semiconductor device, described above with reference to FIGS. 3A and 3B, and may be manufactured based on the manufacturing method, described above with reference to FIGS. 4A to 4H. Since the structure of the memory device 3500 and the method of manufacturing the memory device 3500 are the same as those described above, detailed descriptions thereof will be omitted.

The computing system 3000 having the above-mentioned configuration may be divided into an operating system layer executed in an upper level region and a controller layer executed in a lower level region. Here, the application 3100, the operating system 3200, and the file system 3300 may be included in the operating system layer, and may be executed by a working memory of the computing system 3000. Further, the translation layer 3400 may be included in the operating system layer or the controller layer.

As described above, since the computing system 3000 according to an embodiment of the present disclosure includes the memory device 3500 having an improved integration degree and improved characteristics, the integration degree and characteristics of the computing system 3000 may also be improved.

In accordance with an embodiment of the present disclosure, an etching process of separating a cell plug into a plurality of cell plugs by etching the cell plug in a vertical direction and an etching process of forming a contact plug may be performed together, and thus the number of processing steps may be reduced.

What is claimed is:

1. A semiconductor device, comprising:

a peripheral circuit structure formed on a substrate including a cell region and a contact region;

a cell stacked body formed over the peripheral circuit structure to overlap the cell region;

a dummy stacked body formed over the peripheral circuit structure to overlap the contact region;

a pillar structure penetrating the cell stacked body;

an etch stop layer located over the peripheral circuit structure and overlapping with a bottom surface of the pillar structure;

a cutting structure penetrating the pillar structure in a vertical direction and contacting the etch stop layer; and a contact plug penetrating the dummy stacked body and extending to the peripheral circuit structure, wherein the cutting structure extending from an uppermost portion of the pillar structure in the vertical direction and penetrating through the uppermost portion of the pillar structure.

2. The semiconductor device according to claim 1, further comprising:

a source layer disposed under the cell stacked body, wherein the pillar structure extends into the source layer, and the cutting structure penetrates the source layer.

3. The semiconductor device according to claim 2, further comprising:

an interlayer insulating layer disposed between the source layer and the peripheral circuit structure, wherein the etch stop layer is disposed in the interlayer insulating layer.

4. The semiconductor device according to claim 2, further comprising:

a buffer layer disposed between the peripheral circuit structure and the dummy stacked body.

5. The semiconductor device according to claim 4, wherein a height of a top surface of the source layer is substantially equal to a height of a top surface of the buffer layer.

6. The semiconductor device according to claim 1, wherein the pillar structure comprises a first pillar structure and a second pillar structure separated from each other by the cutting structure.

7. A method of manufacturing a semiconductor device, comprising:

forming a peripheral circuit structure on a substrate including a cell region and a contact region;

forming an interlayer insulating layer over the peripheral circuit structure;

forming an etch stop layer in the interlayer insulating layer;

forming an upper stacked body over the interlayer insulating layer;

forming a pillar structure penetrating the upper stacked body in the cell region; and simultaneously forming a trench and a hole, the trench separating the pillar structure into a first pillar structure and a second pillar structure and the hole passing through the upper stacked body in the contact region, wherein the trench extending from an uppermost portion of the pillar structure in a vertical direction and penetrating through the uppermost portion of the pillar structure.

8. The method according to claim 7, further comprising:

after the trench and the hole are formed, forming a mask pattern covering the hole;

forming a cutting structure by filling the trench with an insulating material; and forming a contact plug by filling the hole with a conductive layer.

9. The method according to claim 8, further comprising:

forming a buffer layer in the contact region between the upper stacked body and the interlayer insulating layer, wherein forming the trench and the hole comprises:

performing together a trench formation etching process of etching the pillar structure such that the etch stop layer is exposed, and a hole formation etching process of etching the upper stacked body, the buffer layer, and the interlayer insulating layer in the contact region such that a peripheral circuit line included in the peripheral circuit structure in the contact region is exposed.

10. The method according to claim 7, further comprising:

forming a lower stacked body over the peripheral circuit structure.

11. The method according to claim 8, further comprising:

after the trench is formed, removing the etch stop layer exposed through the trench.

12. The method according to claim 11, further comprising:

after the etch stop layer is removed, forming the cutting structure by filling a space, from which the etch stop layer is removed, and the trench with the insulating material, wherein a lower portion of the cutting structure has substantially a bottleneck structure.

13. A method of manufacturing a semiconductor device, comprising:

forming a peripheral circuit structure on a substrate including a cell region and a contact region;

forming an interlayer insulating layer over the peripheral circuit structure, and forming an etch stop layer in the interlayer insulating layer;

forming a lower stacked body on the interlayer insulating layer in the cell region, and forming a buffer layer on the interlayer insulating layer in the contact region;

forming an upper stacked body on the lower stacked body and the buffer layer;

forming a pillar structure penetrating the upper stacked body in the cell region; and simultaneously forming a trench and a hole, the trench separating the pillar structure into a first pillar structure and a second pillar structure and the hole passing through the upper stacked body in the contact region, wherein the trench extending from an uppermost portion of the pillar structure in a vertical direction and penetrating through the uppermost portion of the pillar structure.

14. The method according to claim 13, wherein a height of a top surface of the lower stacked body is substantially equal to a height of a top surface of the buffer layer.

15. The method according to claim 13, further comprising:

after the trench and the hole are formed, forming a mask pattern covering the hole;

forming a cutting structure by filling the trench with an insulating material; and forming a contact plug by filling the hole with a conductive layer.

16. The method according to claim 15, wherein forming the trench and the hole comprises:

performing together a trench formation etching process of etching the pillar structure and the lower stacked body such that the etch stop layer is exposed, and a hole formation etching process of etching the upper stacked body, the buffer layer, and the interlayer insulating layer in the contact region such that a peripheral circuit line included in the peripheral circuit structure in the contact region is exposed.

17. The method according to claim 15, further comprising:

after the trench is formed, removing the etch stop layer exposed through the trench.

18. The method according to claim 17, further comprising:

after the etch stop layer is removed, forming the cutting structure by filling a space, from which the etch stop layer is removed, and the trench with the insulating material, wherein a lower portion of the cutting structure has substantially a bottleneck structure.

* * * * *